United States Patent
Strohmann et al.

(10) Patent No.: US 11,087,107 B2
(45) Date of Patent: Aug. 10, 2021

(54) ULTRASONIC SENSOR WITH BI-POLED OR UNI-POLED TRANSMITTER/RECEIVER

(71) Applicant: QUALCOMM Incorporated, San Diego, CA (US)

(72) Inventors: Jessica Liu Strohmann, Cupertino, CA (US); Hrishikesh Vijaykumar Panchawagh, Cupertino, CA (US); Yipeng Lu, Davis, CA (US); Soon Joon Yoon, San Jose, CA (US); Kostadin Dimitrov Djordjev, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/545,741

(22) Filed: Aug. 20, 2019

(65) Prior Publication Data

US 2021/0056277 A1  Feb. 25, 2021

(51) Int. Cl.
*G06K 9/00* (2006.01)
*G06F 3/042* (2006.01)
*H01L 41/253* (2013.01)
*H01L 41/187* (2006.01)
*H01L 41/29* (2013.01)

(52) U.S. Cl.
CPC ....... *G06K 9/0002* (2013.01); *G06K 9/00087* (2013.01); *H01L 41/187* (2013.01); *H01L 41/253* (2013.01); *H01L 41/29* (2013.01)

(58) Field of Classification Search
CPC ........ G06K 9/00006–0012; G06K 2009/0006; H01L 41/16–45
See application file for complete search history.

(56) References Cited

U.S. PATENT DOCUMENTS

| | | | | |
|---|---|---|---|---|
| 9,665,200 | B2* | 5/2017 | Filiz | G06F 3/045 |
| 10,120,478 | B2* | 11/2018 | Filiz | G01L 1/146 |
| 10,146,392 | B2* | 12/2018 | Andoh | G06F 3/04144 |
| 2016/0139717 | A1* | 5/2016 | Filiz | G01L 1/005 345/173 |
| 2016/0231849 | A1* | 8/2016 | Watazu | G06F 3/0445 |
| 2016/0306481 | A1* | 10/2016 | Filiz | G01L 1/146 |
| 2017/0079624 | A1* | 3/2017 | Wadhwa | G06K 9/0002 |
| 2018/0189539 | A1* | 7/2018 | Chen | G06F 3/043 |

(Continued)

FOREIGN PATENT DOCUMENTS

WO  2018200642 A1  11/2018

OTHER PUBLICATIONS

Dahiya R S., et al., "Fundamentals of Piezoelectricity" In: "Robotic Tactile Sensing", Jan. 1, 2013 (Jan. 1, 2013), Springer Netherlands, Dordrecht, XP055744B09, ISBN: 978-94-007-0579-1, pp. 207, 208, 211-226, 195-245.

(Continued)

*Primary Examiner* — Patrick F Marinelli
(74) *Attorney, Agent, or Firm* — Qualcomm Incorporated

(57) ABSTRACT

A device and method for producing said device comprising an improved ultrasonic biometric sensor is disclosed. The ultrasonic biometric sensor is composed of a pixel array and multiple copolymer layers which are polarized in such a fashion as to increase the transmitting pressure and receiving sensitivity of the sensor. The copolymer layers may be polarized in the same direction, or in opposite directions, depending on the desired functionality.

10 Claims, 10 Drawing Sheets

(56) References Cited

U.S. PATENT DOCUMENTS

| | | | | |
|---|---|---|---|---|
| 2018/0310921 A1* | 11/2018 | Wadhwa | ............... | G06K 9/0002 |
| 2018/0373913 A1* | 12/2018 | Panchawagh | ....... | G01S 7/52079 |
| 2019/0065805 A1* | 2/2019 | Zhao | .................... | G01S 7/52085 |
| 2019/0243047 A1* | 8/2019 | Khajeh | ................. | G06F 3/0436 |
| 2020/0125815 A1* | 4/2020 | Lu | ........................ | H01L 51/0097 |
| 2020/0141793 A1* | 5/2020 | Kim | ....................... | B06B 1/0622 |
| 2020/0234021 A1* | 7/2020 | Lu | ......................... | G06K 9/0002 |
| 2020/0257873 A1* | 8/2020 | Heo | ..................... | H01L 27/1214 |
| 2020/0264702 A1* | 8/2020 | Park | ........................ | G06F 3/016 |
| 2020/0272255 A1* | 8/2020 | Panchawagh | ....... | G06F 3/03545 |
| 2020/0279087 A1* | 9/2020 | Seo | ....................... | G06K 9/0002 |
| 2020/0293736 A1* | 9/2020 | Liu | ....................... | H01L 27/323 |
| 2020/0293737 A1* | 9/2020 | Kim | ........................ | H01L 41/09 |

OTHER PUBLICATIONS

International Search Report and Written Opinion—PCT/US2020/047084—ISA/EPO—dated Jan. 13, 2020.

* cited by examiner

ULTRASONIC SENSOR WITH BI-POLED OR UNI-POLED TRANSMITTER/RECEIVER

FIELD

The present disclosure relates to the field of ultrasonic biometric sensors.

BACKGROUND

Some devices, such as smartphones, may support biometric authentication schemes for user access. In the context of a fingerprint imager, an ultrasonic wave may propagate through a surface of the device on which a person's finger may be placed to obtain a fingerprint image. After passing through the surface, some portions of the wave may encounter skin that is in contact with the surface (e.g., fingerprint ridges), while other portions of the ultrasonic wave encounter air (e.g., valleys between adjacent ridges of a fingerprint) and may be reflected with different intensities back towards the ultrasonic fingerprint imager. The reflected signals associated with the finger may be processed and converted to a digital value representing the signal strength of the reflected signal. When multiple reflected signals are collected over a distributed area, the digital values of such signals may be used to produce a graphical representation of the signal strength over the distributed area (e.g., by converting the digital values to an image), thereby producing an image of the fingerprint.

Some ultrasonic fingerprint sensors operate by exciting a piezoelectric material to produce ultrasonic waves. A voltage waveform must be applied to the piezoelectric material in order to produce the ultrasonic waves. The intensity of the ultrasonic waves sent corresponds to the sensitivity of the piezoelectric material and the configuration of the related material in the stack in which the piezoelectric material resides. There currently exists an unmet need to increase the sensitivity of these materials and stacks.

SUMMARY

Herein, a stack of layers is disclosed which operates to enable an ultrasonic biometric sensor. However, although described as a biometric sensor, the sensor may also be used to determine characteristics of non-biological objects, such as physical tokens, keys, or other non-biological objects.

In some cases, devices for ultrasonic sensing operate by detecting aspects of a biometric object when a finger or other body part is placed against a surface of a substrate. Depending on the type of biometric detecting technology employed, there may exist different requirements and limitations for the aforementioned surface and substrate. Optical biometric detecting technology (alternatively known as optical fingerprint technology), for example, requires an optically transparent substrate with a surface that does not interfere with light reflected from the ridges and valleys of a fingerprint. Optical fingerprint sensors typically use a glass substrate, for the optical transparency characteristics, and because the surface of the glass is normally smooth, this provides a good surface for fingerprint detection without need for any extra treatment or coating applied to the surface of the glass substrate.

In the case where an ultrasonic sensor device does not use photoacoustic technology, the device will emit ultrasonic waves and measure the reflection of the ultrasonic waves from an object. In the case where in ultrasonic sensor device uses photoacoustic technology, typically the device will excite ultrasonic emissions in the ultrasound range from an object via the photoacoustic effect, and the device will receive the ultrasonic emissions from the object and will determine characteristics of the object from characteristics of the emissions.

Ultrasonic sensors may be applied to glass, similarly to optical sensors, but also to metal, plastic, ceramic, and other opaque materials that do not allow light transmission as does glass.

Typically, conventional ultrasonic sensors have a stack-up of multiple layers which includes a single copolymer layer that exhibits a piezoelectric response.

In some embodiments of ultrasonic sensors, the acoustic signal produced by a single copolymer transmitter is not strong enough to achieve an acceptable performance. Similarly, in some embodiments of ultrasonic sensors, the sensitivity of the single copolymer receiver does not have enough sensitivity to produce an adequate voltage for sensing. One potential solution is to use a transmitting material with a higher piezoelectric coefficient, but this may not be a practical solution due to manufacturability and cost. Another possible solution is to use multiple active bi-poled or uni-poled copolymer layers as the transmitter and/or receiver in the stack-up of the ultrasound sensor. Such a configuration with more than one copolymer layer may be termed a multi-copolymer sensor, a multi-copolymer stack, or multi-copolymer layer transmit/receive configuration or sensor.

A multi-copolymer transmit or receive configuration in an ultrasonic sensor stack may have copolymer layers with the same, or opposite poling direction. Additionally, there may be sets of layers, with each set having the same or opposite poling direction. Layers in a set may not be proximate to one another, but may skip other layers, including other copolymer layers, in order to form a set.

A multi-copolymer layer sensor provides the advantage of a higher acoustic pressure, when operated in a transmit mode, and better pressure to voltage transduction when operated in a receive mode.

Single copolymer layer sensors exhibit background noise even when not in an operational mode. Typically, this background noise energy is subtracted from an active measurement in order to increase the signal-to-noise ratio. However, this background noise energy can usually only be estimated, therefore subtracting it does not leave only the signal—there may be some residual noise.

Multi-copolymer layer sensors provide a further advantage in solving the aforementioned problem by enabling a signal-to-noise ratio greater than the aforementioned single copolymer layer sensor due to better removal of the background noise energy. In multi-copolymer layer sensor with two copolymer layers, for example, this background noise would be exhibited as a common-mode noise on both layers. This noise may then be removed by differential sensing.

An additional advantage of the multi-copolymer layer sensor, with lower common-mode noise, is that there may be a constant gain on the input circuitry across frequency because common-mode noise is not necessarily constant over frequency, thus removing it allows a constant gain to be tuned for the signal only.

A further advantage of the multi-copolymer layer sensor with lower common-mode noise is that it may allow a narrower dynamic range on an analog-to-digital converter that receives output from the sensor.

In an embodiment, one copolymer layer may be a first type of material, and a second copolymer layer may be a second type of material. Acceptable materials may include piezoelectric ceramic, crystal, polymer, lead zirconium titanate, aluminum nitride, or other materials that have a suitable piezoelectric response.

A process for producing a multi-copolymer layer sensor composed of different copolymer materials is also herein disclosed. A process for producing a multi-copolymer layer sensor composed of multiple copolymer materials may include poling in a first direction at a first temperature for a first amount of time, annealing at a second temperature, typically a temperature between the Curie temperature of the first copolymer and that of the second copolymer, for a second amount of time, and poling in a second direction at a third temperature for a third amount of time.

An alternative process for producing a multi-copolymer layer sensor composed of multiple copolymer materials may include poling and annealing in a first direction at a first temperature for a first amount of time, lowering temperature to between the Curie temperatures and poling in a second direction at a second temperature for a second amount of time and lowering temperature to room temperature.

In an embodiment, an apparatus for biometric sensing, the apparatus may comprise a pixel array, a first copolymer layer, a second copolymer layer, a first electrode, and a second electrode, wherein a top side of the first copolymer layer is proximate to the pixel array, a bottom side of the first copolymer layer is bonded to a top side of the first electrode, a bottom side of the first electrode is bonded to a top side of the second copolymer, and a bottom side of the second copolymer is bonded to a top side of the second electrode.

In an embodiment, the first copolymer layer may have a first polarization, and the second copolymer may have a second polarization. The first polarization direction may be the same as the second polarization. In an alternative, the first polarization may be in the opposite direction of the second polarization.

In an embodiment, there may be additional copolymer layers to the aforementioned first two. The apparatus may further comprise a third copolymer layer, a fourth copolymer layer, a third electrode, and a fourth electrode, wherein a top side of the third copolymer layer is bonded to a bottom side of the second electrode, a bottom side of the third copolymer layer is bonded to a top side of the third electrode, a bottom side of the third electrode is bonded to a top side of the fourth copolymer, and a bottom side of the fourth copolymer is bonded to a top side of the fourth electrode.

In an embodiment with more than two copolymer layers, the copolymer layers may be composed of different copolymer types. For example, the first and third copolymer may be of a first material, and the second and fourth copolymer layer may be of a second material, wherein the first and second materials are different materials. In an alternative, the first and second copolymer layers may be of a first material, and the third and fourth copolymer layer may be of a second material. In an alternative, the first and second materials may be different materials. The different materials provide the advantage of enabling a manufacturer to polarize the copolymer layers at different temperatures after the stack has already been assembled. Due to the different Curie temperatures of the materials, an already-built stack can have one copolymer layer polarized in a first direction at a first temperature, and a second copolymer layer polarized in a second direction at a second temperature.

In an embodiment, the first copolymer layer may have a first polarization direction, the second copolymer may have a second polarization direction, the third copolymer may have a third polarization direction, and the fourth copolymer may have a fourth copolymer direction. The first and third copolymers may have a first polarization direction, and the second and fourth copolymers may have a second polarization direction. The first polarization direction and second polarization direction may be the same or opposite to one another. In an alternative, the first and second copolymers may have a first polarization direction, and the third and fourth copolymers may have a second polarization direction. The first polarization direction and second polarization direction may be the same or opposite to one another.

In the embodiments disclosed herein, the first copolymer layer may be of a first material type, and the second copolymer layer may be of a second material type. The first material type may have a first curie temperature, and the second material type may have a second curie temperature. The third copolymer layer may be of a third material type, and the fourth material may be of a fourth material type. The third material type may have a third curie temperature, and the fourth material type may have a fourth curie temperature.

In an embodiment, a thickness of a first or second electrode may be less than 30 um (a small portion of a wavelength of an ultrasonic wave) for the purpose of the same phase of an ultrasonic wave being applied to the two neighboring copolymer layers.

In an embodiment, a thickness of the first or second electrode may be greater than 150 um (about a half-wavelength of an ultrasonic wave) for the purpose of the opposite phase of an ultrasonic wave being applied to the two neighboring copolymer layers.

In an embodiment, the display may be proximate to the pixel array. In an alternative, the display may be adhered to a TFT glass or flexible substrate that carries the pixel array.

In an embodiment, the display may be proximate to a copolymer layer. The display may be adhered, via a first adhesive layer, to a side of the copolymer layer.

In an embodiment, an apparatus for biometric sensing may be prepared by a process including the steps of adhering a pixel array to a first side of a first copolymer layer, adhering a first electrode to a second side of the first copolymer layer, adhering a first side of a second copolymer layer to a second side of the first electrode, adhering a first side of the second electrode to a second side of the second copolymer layer, heating or cooling the apparatus to a first curie temperature of the first copolymer layer and poling in a first polarization direction, and heating or cooling the apparatus to a second curie temperature of the second copolymer and poling in a second polarization direction.

In an embodiment, the first polarization direction and second polarization direction are the same direction. In an alternative, the first polarization direction and second polarization direction are opposite.

In an embodiment, an apparatus for biometric sensing may be prepared by the aforementioned process further including adhering a first side of a third copolymer layer to a second side of the second electrode, adhering a second side of the third copolymer layer to a first side of a third electrode, and adhering a second side of the third electrode to a first side of a fourth copolymer layer.

In an embodiment, a third curie temperature of the third copolymer layer is the same as the first curie temperature of the first copolymer layer, and a fourth curie temperature of the fourth copolymer layer is the same as the second curie temperature of the second copolymer layer. In an alternative, the first, second, third, and fourth curie temperature are the same temperature.

In an embodiment, the display may be adhered to the pixel array. In an alternative, the display may be adhered to a TFT glass or flexible substrate that carries the pixel array.

In an embodiment, the display may be adhered to a copolymer layer. The display may be adhered, via an adhesive layer, to a side of the copolymer layer.

It will be appreciated that a number of alternative configurations and fabrication techniques may be contemplated.

DETAILED DESCRIPTION

Figure 1A:
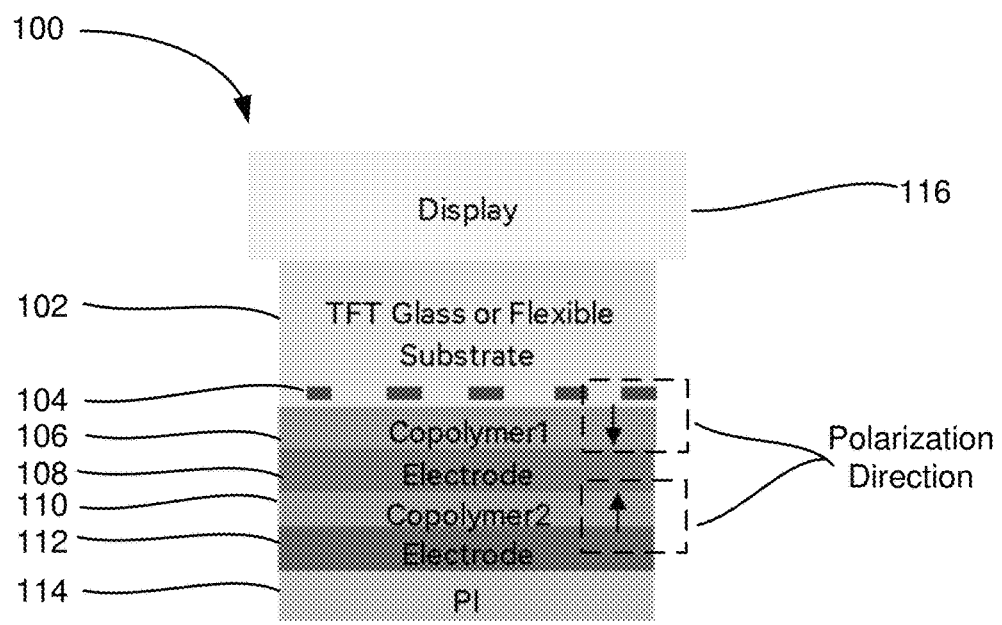
FIG. 1A shows a representative example of a side-view cutaway of an ultrasonic sensor with multiple copolymer layers, with bi-poling directions.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, mobile or otherwise, apparatus, or system that includes a biometric system as disclosed herein. In addition, it is contemplated that the described implementations may be included in or associated with a variety of electronic devices, and device housings associated with devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, etc., Bluetooth® devices, personal data assistants (PDAs), wireless electronic mail receivers, handheld or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices.

The teachings herein also may be used in applications such as, but not limited to, electronic switching devices, motion-sensing devices, parts of consumer electronics products, steering wheels, door handle mechanisms, or other automobile parts, liquid crystal devices, electrophoretic devices, and electronic test equipment. Thus, the teachings are not intended to be limited to the implementations depicted solely in the Figures, but instead have wide applicability as will be readily apparent to one having ordinary skill in the art.

Various implementations disclosed herein may include a biometric system, such as a biometric sensor or fingerprint sensor, that is capable of ultrasonic imaging of resultant acoustic wave generation. Some such implementations may be capable of obtaining images from bones, muscle tissue, blood, blood vessels, veins, capillaries, and/or other sub-epidermal features. As used herein, the term "sub-epidermal features" may refer to any of the tissue layers that underlie the epidermis, including the dermis, the subcutis, etc., and any blood vessels, lymph vessels, sweat glands, hair follicles, hair papilla, fat lobules, etc., that may be present within such tissue layers. Some implementations may be capable of biometric authentication that is based, at least in part, on image data obtained via ultrasonic imaging. In some examples, an authentication process may be based on image data obtained via photoacoustic imaging and also on image data obtained by transmitting ultrasonic waves and detecting corresponding reflected ultrasonic waves.

Herein, the term "adhere" may refer to any process to affix one object, layer, or module to another. The process of adhering one object, layer, or module to another may include deposition, wherein, for instance, if an electrode is said to be adhered to a copolymer layer that may indicate that the electrode is physically deposited onto the copolymer layer by a chemical vapor deposition process, or by placing a fully-formed electrode layer onto a copolymer layer, or other suitable means. The inverse may be true, wherein, for instance, if an electrode is said to be adhered to a copolymer layer that may indicate that the copolymer layer is physically deposited onto the electrode by a chemical process, by placing a fully-formed copolymer layer onto an electrode, or other suitable means. The term "adhere" does not imply that there must be an adhesive chemical present, although there may be an adhesive chemical used. The term "adhere" also does not imply that two items are permanently affixed—they may be pried apart if enough force is applied.

FIG. 1A shows a representative example of a side-view cutaway of an ultrasonic sensor with multi-copolymer layers 100. Display 116 may be a thin-film transistor (TFT), OLED, LCD, or other suitable display technology. Display 116 may be adhered to a TFT glass or flexible substrate 102. Pixel array 104 is comprised of multiple pixels. Each pixel may, for example, be associated with a local region of piezoelectric sensor material, a peak detection diode and a readout transistor; many or all of these elements may be formed on or in the backplane to form the pixel circuit. In practice, the local region of piezoelectric sensor material of each pixel may transduce received ultrasonic energy into electrical charges. The peak detection diode may register the maximum amount of charge detected by the local region of piezoelectric sensor material. Each row of the pixel array may then be scanned, e.g., through a row select mechanism, a gate driver, or a shift register, and the readout transistor for each column may be triggered to allow the magnitude of the peak charge for each pixel to be read by additional circuitry, e.g., a multiplexer and an A/D converter. The pixel circuit may include one or more TFTs to allow gating, addressing, and resetting of the pixel.

In FIG. 1A, a first copolymer layer 106 may be adhered to the pixel array 104 or TFT glass of flexible substrate 102. A first electrode 108 may be adhered to the first copolymer layer 106. A second copolymer layer 110 may be adhered to the first electrode 108. A second electrode 112 may be adhered to the second copolymer layer 110. The second copolymer layer 110 may be adhered to a substrate layer 114. The substrate layer 114 may be polyimide, or a die attach film, or other suitable substrate.

In FIG. 1A, the polarization directions of the first copolymer layer 106 and the second copolymer layer 110 is shown in the dashed boxes indicated by "Polarization Direction." In FIG. 1A, a polarization direction of the first copolymer layer 106 is downwards as indicated by the arrow in the dashed box, and a second polarization direction of the second copolymer layer 110 is upwards and opposite to the first copolymer layer 106 as indicated by the arrow in the dashed box.

In an implementation, the first electrode 108 may be grounded or floating. In another implementation, the second electrode 112 may be grounded or floating.

Figure 1B:
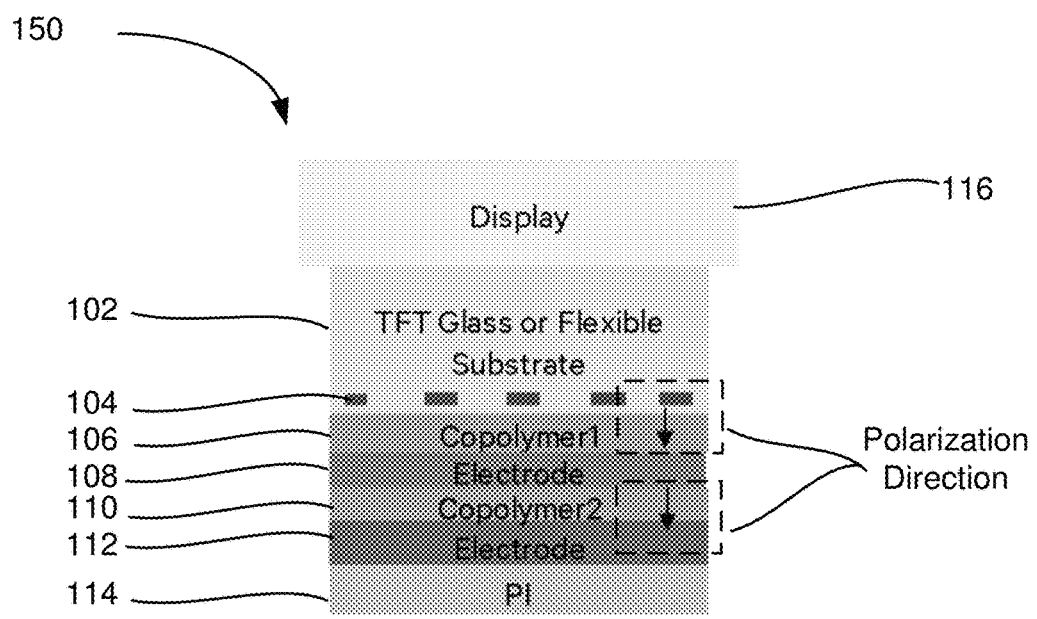
FIG. 1B shows a representative example of a side-view cutaway of an alternative embodiment of an ultrasonic sensor with multiple copolymer layers, with uni-poling direction.

FIG. 1B shows a representative example of a side-view cutaway of an alternative embodiment of an ultrasonic sensor with multi-copolymer layers 150. Display 116 may be a thin-film transistor (TFT), OLED, LCD, or other suitable display technology. Display 116 may be adhered to a TFT glass or flexible substrate 102. Pixel array 104 is comprised of multiple pixels. Each pixel may, for example, be associated with a local region of piezoelectric sensor material, a peak detection diode and a readout transistor; many or all of these elements may be formed on or in the backplane to form the pixel circuit. In practice, the local region of piezoelectric sensor material of each pixel may transduce received ultrasonic energy into electrical charges. The peak detection diode may register the maximum amount of charge detected by the local region of piezoelectric sensor material. Each row of the pixel array may then be scanned, e.g., through a row select mechanism, a gate driver, or a shift register, and the readout transistor for each column may be triggered to allow the magnitude of the peak charge for each pixel to be read by additional circuitry, e.g., a multiplexer and an A/D converter. The pixel circuit may include one or more TFTs to allow gating, addressing, and resetting of the pixel.

In FIG. 1B, a first copolymer layer 106 may be adhered to the pixel array 104 or TFT glass of flexible substrate 102. A first electrode 108 may be adhered to the first copolymer layer 106. A second copolymer layer 110 may be adhered to the first electrode 108. A second electrode 112 may be adhered to the second copolymer layer 110. The second copolymer layer 110 may be adhered to a substrate layer 114. The substrate layer 114 may be polyimide, or a die attach film, or other suitable substrate.

In FIG. 1B, the polarization directions of the first copolymer layer 106 and the second copolymer layer 110 is shown in the dashed boxes indicated by "Polarization Direction." In FIG. 1A, a polarization direction of the first copolymer layer 106 is downwards as indicated by the arrow in the dashed box, and a second polarization direction of the second copolymer layer 110 is downwards and the same as the first copolymer layer 106 as indicated by the arrow in the dashed box.

In FIGS. 1A and 1B and other embodiments, the first and second copolymer layers 106 and 110 may include a piezoelectric material. Examples of piezoelectric materials that may be employed according to various implementations include piezoelectric polymers having appropriate acoustic properties, for example, an acoustic impedance between about 2.5 MRayls and 5 MRayls. Specific examples of piezoelectric materials that may be employed include ferroelectric polymers such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDR-TrFE. Other examples of piezoelectric materials that may be employed include polyvinylidene chloride (PVDC) homopolymers and copolymers, polytetrafluoroethylene (PTFE) homopolymers and copolymers, and diisopropylammonium bromide (DIPAB), piezoelectric ceramics or crystals.

In FIGS. 1A and 1B and other embodiments, the thickness of each of the first copolymer layer 106 and second copolymer layer 110 may be selected so as to be suitable for generating and receiving ultrasonic waves. In one example, a PVDF first copolymer layer 106 or second copolymer layer 110 is approximately 28 µm thick. Alternatively, a first copolymer layer 106 or second copolymer layer 110 is a PVDF-TrFE layer approximately 12 µm thick. Example frequencies of the ultrasonic waves produced and received by the first copolymer layer 106 and second copolymer layer 110 are in the range of 5 MHz to 30 MHz, with wavelengths on the order of a quarter of a millimeter or less.

Figure 2A:
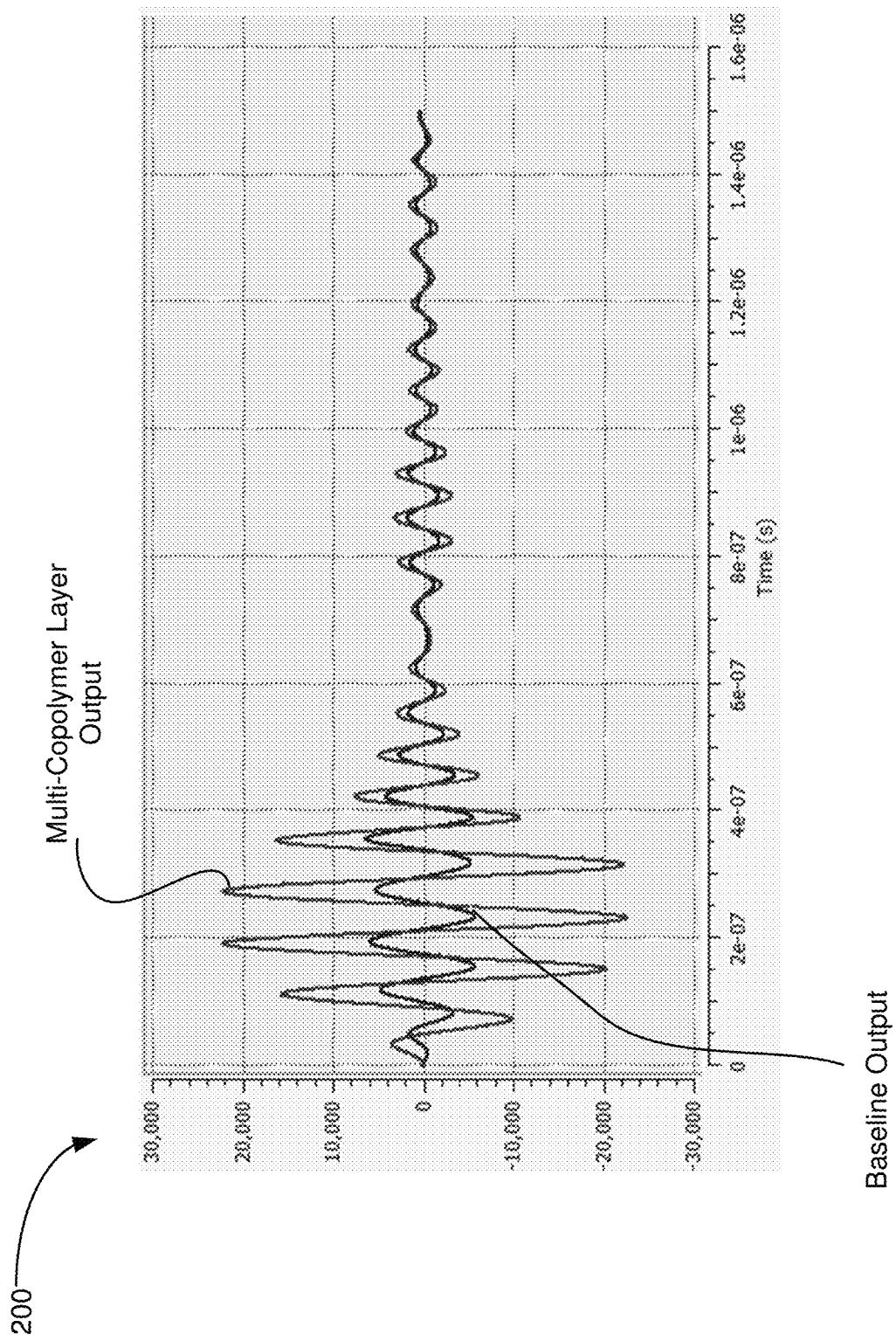
FIG. 2A is an exemplary plot of an ultrasonic sensor with multiple copolymer layers average acoustic pressure output in the copolymer versus a single-copolymer layer acoustic pressure output.

FIG. 2A is a plot 200 of an exemplary output of a multi-copolymer layer acoustic output versus a single-copolymer layer acoustic output. The y-axis represents an exemplary unitless pressure measurement and the x-axis represents time. The line labeled "Multi-Copolymer Layer Output" represents the pressure output, given a nominal voltage input at around 12 MHz, from a multi-copolymer layer ultrasonic sensor. The line labeled "Baseline Output" represents the pressure output, given a nominal voltage input at around 12 MHz, from a single-copolymer layer ultrasonic sensor. The advantage of the multi-copolymer layer output is clear—here the pressure output is more than double that of the single-copolymer layer ultrasonic sensor.

Figure 2B:
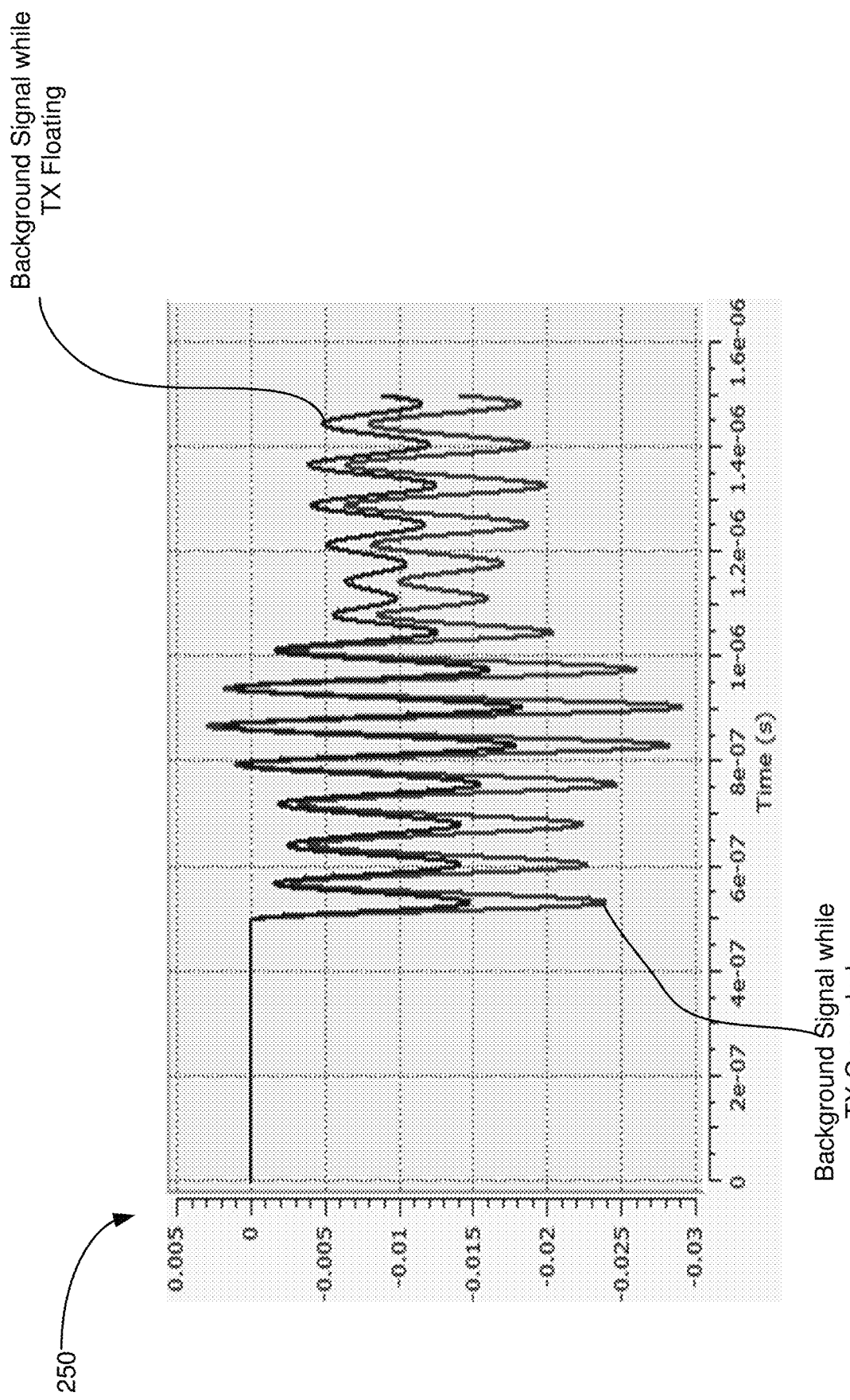
FIG. 2B is an exemplary plot of an ultrasonic sensor with multiple copolymer layers receiving voltage output when the middle common electrode is grounded comparing to that when it is floating.

FIG. 2B is an example of the background signal of an ultrasonic sensor with multi-copolymer layers when the first electrode 108 is grounded comparing to that when it is floating. The peak to peak delta of the output signal is the same as while grounded, while background cancellation works better with first electrode 108 floating. In this specific example, the sensor operating at 12 MHz, the "Background Signal while TX Floating" is only 62.5% of the "Background Signal while TX Grounded."

Figure 3A:
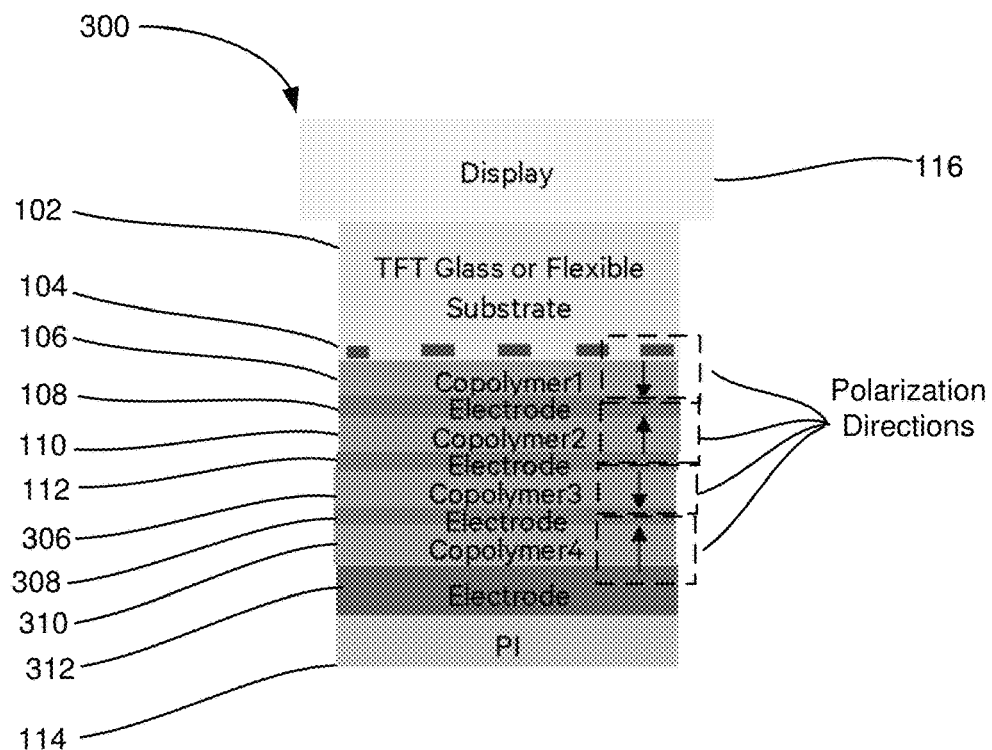
FIG. 3A shows a representative example of a side-view cutaway of an alternative embodiment of an ultrasonic sensor with multiple copolymer layers, with bi-poling directions

FIG. 3A shows a representative example of a side-view cutaway of an alternative embodiment of an ultrasonic sensor with multi-copolymer layers 300. Display 116 may be a thin-film transistor (TFT), OLED, LCD, or other suitable display technology. Display 116 may be adhered to a TFT glass or flexible substrate 102. Pixel array 104 is comprised of multiple pixels. Each pixel may, for example, be associated with a local region of piezoelectric sensor material, a peak detection diode and a readout transistor; many or all of these elements may be formed on or in the backplane to form the pixel circuit. In practice, the local region of piezoelectric sensor material of each pixel may transduce received ultrasonic energy into electrical charges. The peak detection diode may register the maximum amount of charge detected by the local region of piezoelectric sensor material. Each row of the pixel array may then be scanned, e.g., through a row select mechanism, a gate driver, or a shift register, and the readout transistor for each column may be triggered to allow the magnitude of the peak charge for each pixel to be read by additional circuitry, e.g., a multiplexer and an A/D converter. The pixel circuit may include one or more TFTs to allow gating, addressing, and resetting of the pixel.

In FIG. 3A, a first copolymer layer 106 may be adhered to the pixel array 104 or TFT glass of flexible substrate 102. A first electrode 108 may be adhered to the first copolymer layer 106. A second copolymer layer 110 may be adhered to the first electrode 108. A second electrode 112 may be adhered to the second copolymer layer 110. A third copolymer layer 306 may be adhered to the second electrode 112. A third electrode 308 may be adhered to the third copolymer layer 306. A fourth copolymer layer 310 may be adhered to the third electrode 308. A fourth electrode 312 may be adhered to the fourth copolymer layer 310. The fourth electrode 312 may be adhered to a substrate layer 114. The substrate layer 114 may be polyimide, or a die attach film, or other suitable substrate.

In FIG. 3A, the polarization directions of the first copolymer layer 106, the second copolymer layer 110, the third copolymer layer 306, and the fourth copolymer layer 310 is shown in the dashed boxes indicated by "Polarization Direction." In FIG. 3A, a polarization direction of the first copolymer layer 106 is downwards as indicated by the arrow in the dashed box; a second polarization direction of the second copolymer layer 110 is upwards and opposite to the first copolymer layer 106 as indicated by the arrow in the dashed box; a third polarization direction of the third copolymer layer 306 is downwards as indicated by the arrow in the dashed box; a fourth polarization direction of the fourth copolymer layer 310 is upwards as indicated by the arrow in the dashed box.

Figure 3B:
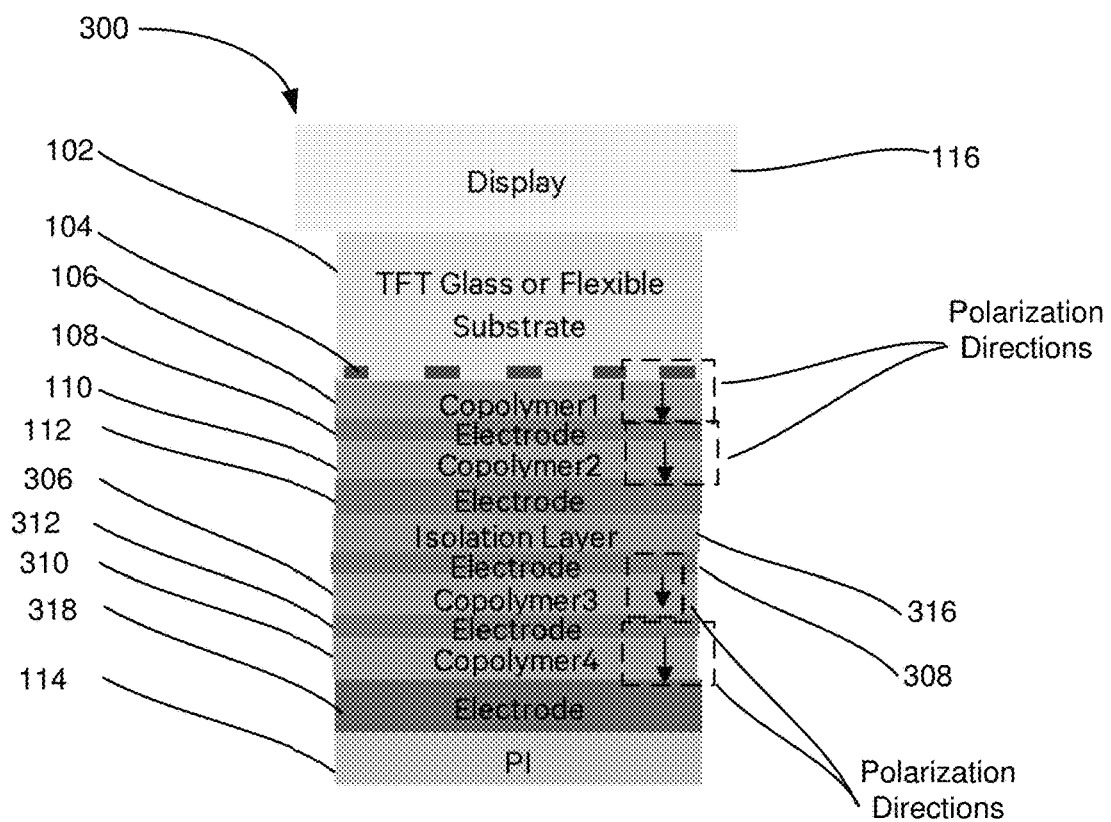
FIG. 3B shows a representative example of a side-view cutaway of an alternative embodiment of an ultrasonic sensor with multiple copolymer layers, with uni-poling direction.

FIG. 3B shows a representative example of a side-view cutaway of an alternative embodiment of an ultrasonic sensor with multi-copolymer layers 150. Display 116 may be a thin-film transistor (TFT), OLED, LCD, or other suitable display technology. Display 116 may be adhered to a TFT glass or flexible substrate 102. Pixel array 104 is comprised of multiple pixels. Each pixel may, for example, be associated with a local region of piezoelectric sensor material, a peak detection diode and a readout transistor; many or all of these elements may be formed on or in the backplane to form the pixel circuit. In practice, the local region of piezoelectric sensor material of each pixel may transduce received ultrasonic energy into electrical charges. The peak detection diode may register the maximum amount of charge detected by the local region of piezoelectric sensor material. Each row of the pixel array may then be scanned, e.g., through a row select mechanism, a gate driver, or a shift register, and the readout transistor for each column may be triggered to allow the magnitude of the peak charge for each pixel to be read by additional circuitry, e.g., a multiplexer and an A/D converter. The pixel circuit may include one or more TFTs to allow gating, addressing, and resetting of the pixel.

In FIG. 3B, a first copolymer layer 106 may be adhered to the pixel array 104 or TFT glass of flexible substrate 102. A first electrode 108 may be adhered to the first copolymer layer 106. A second copolymer layer 110 may be adhered to the first electrode 108. A second electrode 112 may be adhered to the second copolymer layer 110. An isolation layer 316, typically a dielectric layer, may be implemented to separate the charge on second electrode 112 and third electrode 308, and may be adhered to the second electrode 112. A third electrode 308 may be adhered to the isolation layer 316. A third copolymer layer 306 may be adhered to the third electrode 308. A fourth electrode 312 may be adhered to the third copolymer layer 306. A fourth copolymer layer 310 may be adhered to the fourth electrode 312. A fifth electrode 318 may be adhered to the fourth copolymer layer 310. The fifth electrode 318 may be adhered to a substrate layer 114. The substrate layer 114 may be polyimide, or a die attach film, or other suitable substrate.

In FIG. 3B, the polarization directions of the first copolymer layer 106, the second copolymer layer 110, the third copolymer layer 306, and the fourth copolymer layer 310 is shown in the dashed boxes indicated by "Polarization Directions." In FIG. 3B, a polarization direction of the first copolymer layer 106 is downwards as indicated by the arrow in the dashed box; a second polarization direction of the second copolymer layer 110 is downwards and the same as the first copolymer layer 106 as indicated by the arrow in the dashed box; a third polarization direction of the third copolymer layer 306 is downwards as indicated by the arrow in the dashed box; a fourth polarization direction of the fourth copolymer layer 310 is downwards as indicated by the arrow in the dashed box.

Figure 4A:
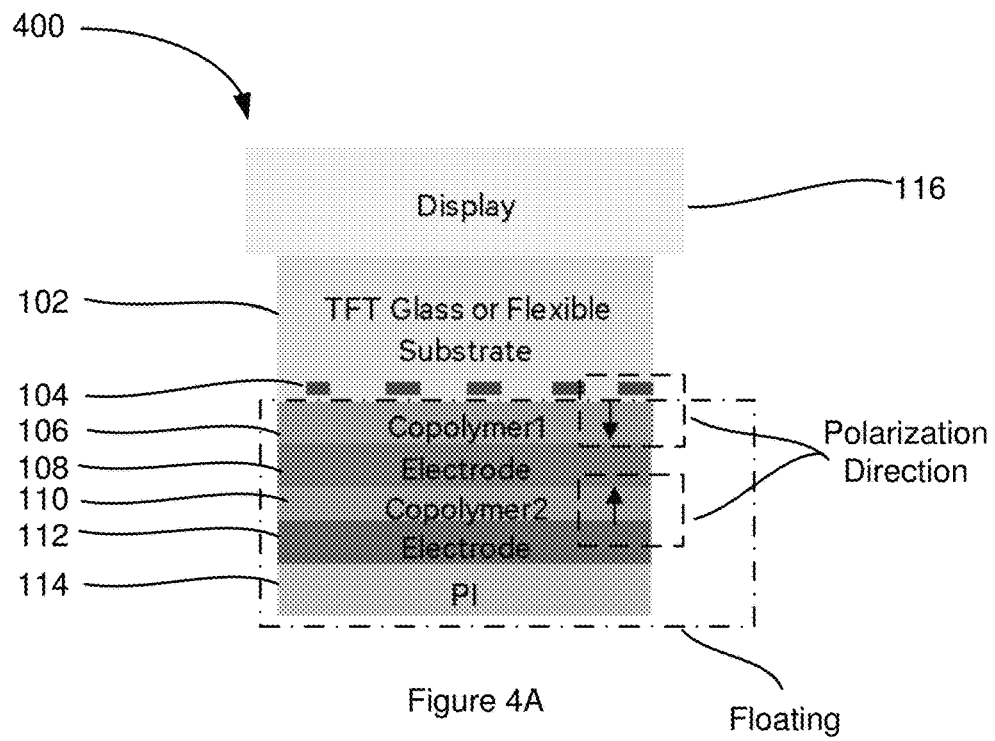
FIG. 4A shows a representative example of a side-view cutaway of an ultrasonic sensor with multiple copolymer layers with bi-poling operating in a receive mode.

FIG. 4A shows a representative example of a side-view cutaway of an ultrasonic sensor with multiple copolymer layers operating in a receive mode 400. While in a receive mode, first copolymer layer 106, first electrode 108, second copolymer layer 110, second electrode 112 and the substrate layer 114 may be floating, i.e. ungrounded, as shown by the dashed box labeled "Floating" around first copolymer layer 106, first electrode 108, second copolymer layer 110, second electrode 112 and the substrate layer 114. In alternative embodiments with additional or other layers, such additional or other layers may also be left floating.

Figure 4B:
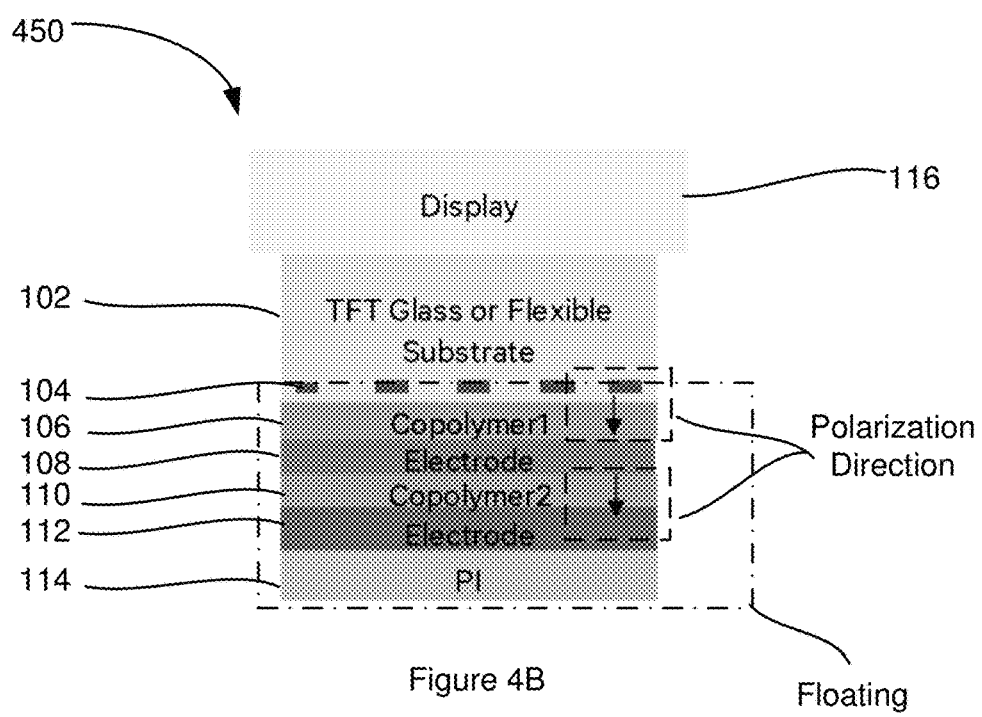
FIG. 4B shows a representative example of a side-view cutaway of an alternative embodiment of an ultrasonic sensor with multiple copolymer layers with uni-poling operating in a receive mode.

FIG. 4B shows a representative example of a side-view cutaway of an alternative embodiment of an ultrasonic sensor with multiple copolymer layers operating in a receive mode 450. While in a receive mode, first copolymer layer 106, first electrode 108, second copolymer layer 110, second electrode 112 and the substrate layer 114 may be floating, i.e. ungrounded, as shown by the dashed box labeled "Floating" around first copolymer layer 106, first electrode 108, second copolymer layer 110, second electrode 112 and the substrate layer 114. In alternative embodiments with additional or other layers, such additional or other layers may also be left floating. In alternative embodiments, the layers in the dashed box labeled "Floating" around first copolymer layer 106, first electrode 108, second copolymer layer 110, second electrode 112 and the substrate layer 114 may be individually grounded, have sets of layers grounded, or have all layers grounded.

Figure 5A:
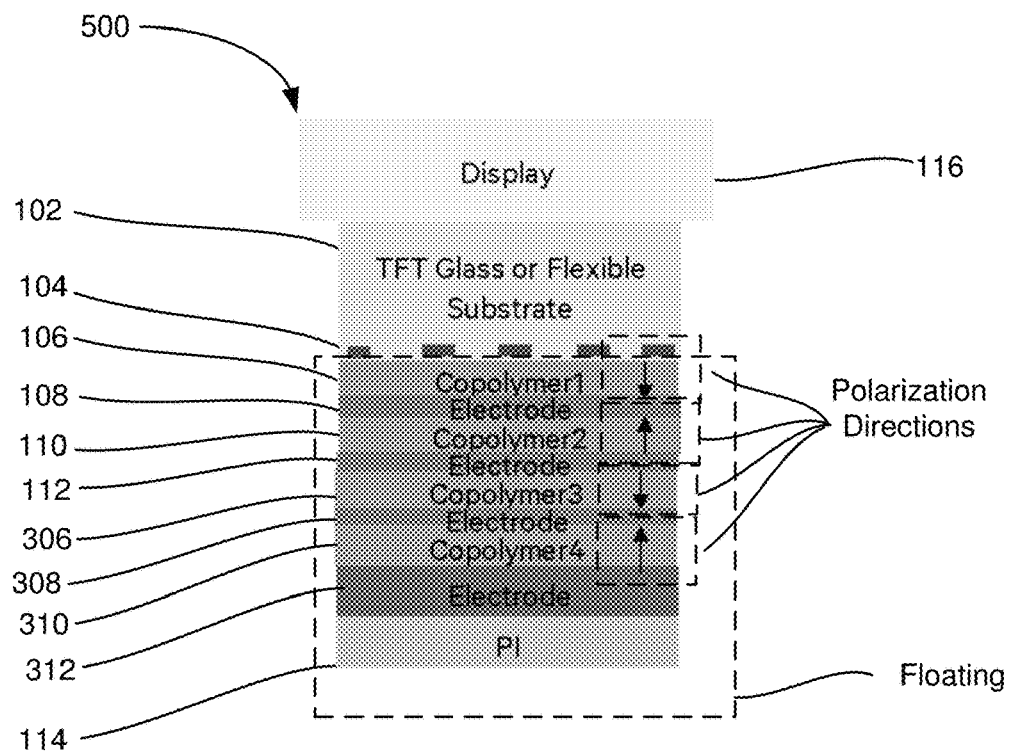
FIG. 5A shows a representative example of a side-view cutaway of an alternative embodiment of an ultrasonic sensor with multiple copolymer layers with bi-poling operating in a receive mode.

FIG. 5A shows a representative example of a side-view cutaway of an alternative embodiment of an ultrasonic sensor with multiple copolymer layers operating in a receive mode 500. While in a receive mode, first copolymer layer 106, first electrode, first copolymer layer 106, second copolymer layer 110, first electrode 108, second electrode 112, third copolymer layer 306, third electrode 308, fourth copolymer layer 310, fourth electrode 312 and substrate layer 114 may be floating, i.e. ungrounded, as shown by the dashed box labeled "Floating" around first copolymer layer 106, first electrode, first copolymer layer 106, second copolymer layer 110, first electrode 108, second electrode 112, third copolymer layer 306, third electrode 308, fourth copolymer layer 310, fourth electrode 312 and substrate layer 114. In alternative embodiments with additional or other layers, such additional or other layers may also be left floating. In alternative embodiments, such layers in the dashed box may be grounded individually or in sets.

Figure 5B:
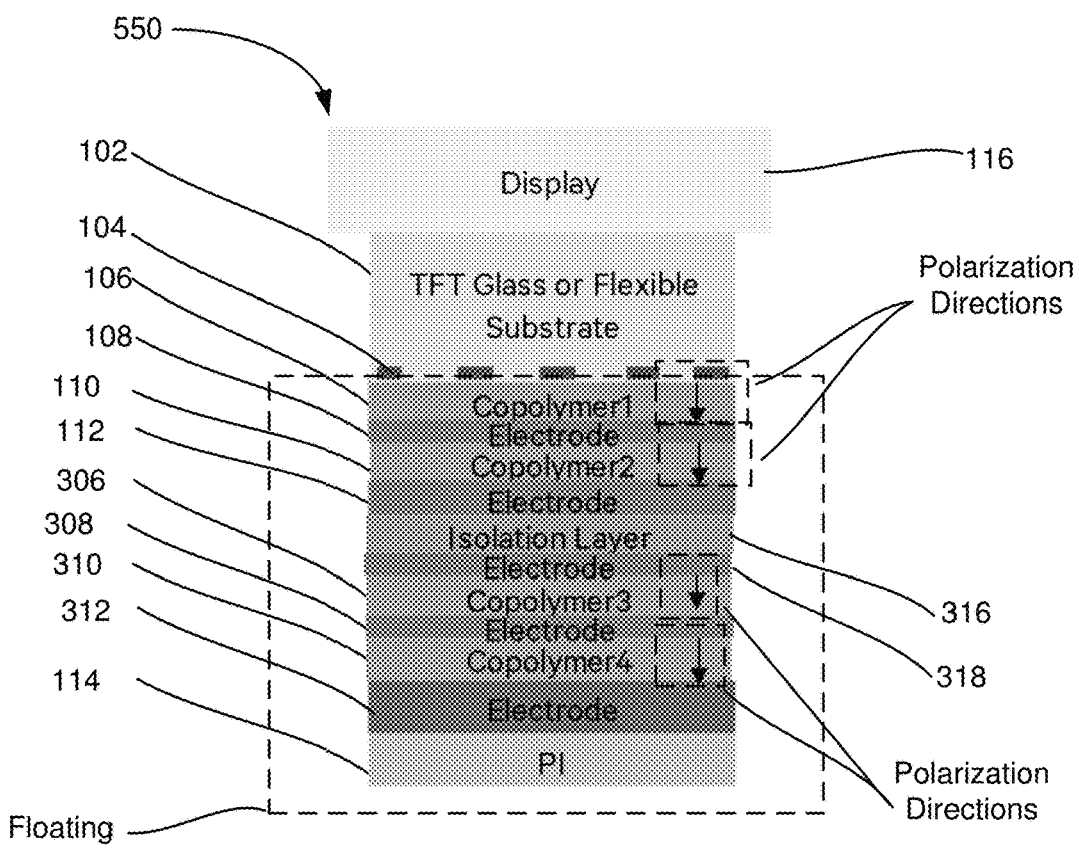
FIG. 5B shows a representative example of a side-view cutaway of an alternative embodiment of an ultrasonic sensor with multiple copolymer layers with uni-poling operating in a receive mode.

FIG. 5B shows a representative example of a side-view cutaway of an alternative embodiment of an ultrasonic sensor with multiple copolymer layers operating in a receive mode 550. While in a receive mode, first copolymer layer 106, first electrode, first copolymer layer 106, second copolymer layer 110, first electrode 108, second electrode 112, third copolymer layer 306, third electrode 308, fourth copolymer layer 310, fourth electrode 312, isolation layer 316, fifth electrode 318, and substrate layer 114 may be floating, i.e. ungrounded, as shown by the dashed box labeled "Floating" around first copolymer layer 106, first electrode, first copolymer layer 106, second copolymer layer 110, first electrode 108, second electrode 112, third copolymer layer 306, third electrode 308, fourth copolymer layer 310, fourth electrode 312, isolation layer 316, fifth electrode 318, and substrate layer 114. In alternative embodiments with additional or other layers, such additional or other layers may also be left floating. In alternative embodiments, such layers in the dashed box may also be grounded individually or in sets.

Figure 6A:
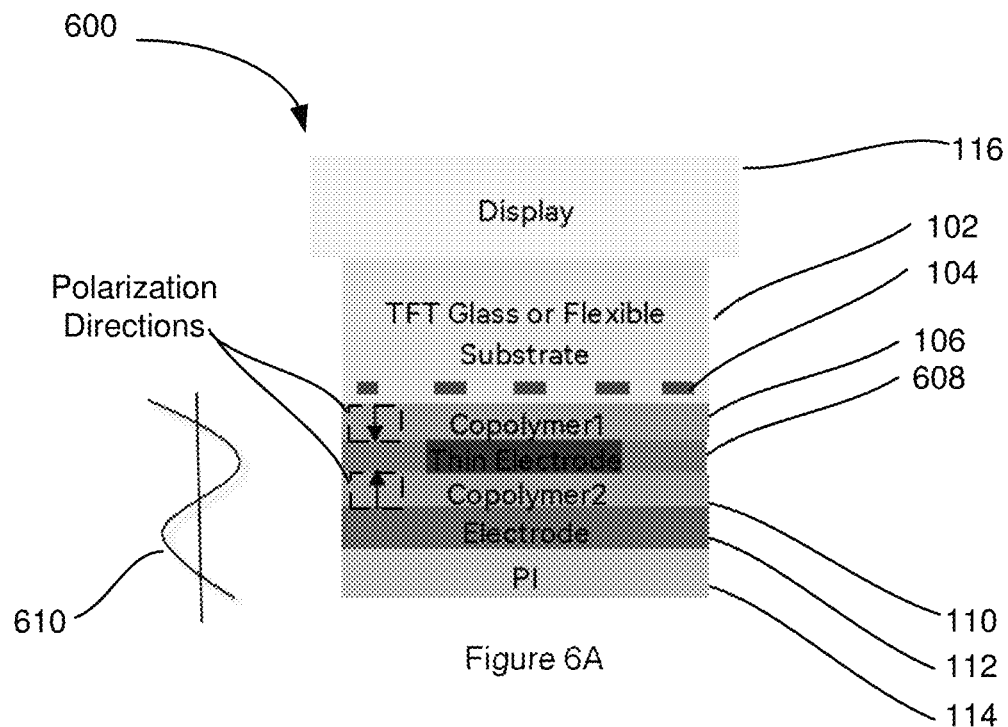
FIG. 6A shows a representative example of a side-view cutaway of an alternative embodiment of an ultrasonic sensor with multiple copolymer layers with bi-poling directions and a thin electrode.

FIG. 6A shows a representative example of a side-view cutaway of an alternative embodiment of an ultrasonic sensor with multiple copolymer layers with a thin electrode 600. In FIG. 6A, a first copolymer layer 106 may be adhered to the pixel array 104 or TFT glass of flexible substrate 102.

A thin electrode 608 may be adhered to the first copolymer layer 106. A second copolymer layer 110 may be adhered to the thin electrode 608. A second electrode 112 may be adhered to the second copolymer layer 110. The second copolymer layer 110 may be adhered to a substrate layer 114. The substrate layer 114 may be polyimide, or a die attach film, or other suitable substrate. The thin electrode 608 may be between 2 um to 30 um. The thin electrode 608 should be thin enough such that the peak of an incident wave 610 traveling through the stack 600 would expose at least 80% of the peak amplitude to the first copolymer layer 106 and second copolymer layer 110 substantially simultaneously.

In FIG. 6A, the polarization directions of the first copolymer layer 106 and the second copolymer layer 110 is shown in the dashed boxes indicated by "Polarization Direction." In FIG. 6A, a polarization direction of the first copolymer layer 106 is downwards as indicated by the arrow in the dashed box, and a second polarization direction of the second copolymer layer 110 is upwards and opposite to the first copolymer layer 106 as indicated by the arrow in the dashed box. This embodiment of FIG. 6A may be termed a parallel bilayer configuration. An advantage of this embodiment would be a smaller overall thickness and friendly packaging/integration.

Figure 6B:
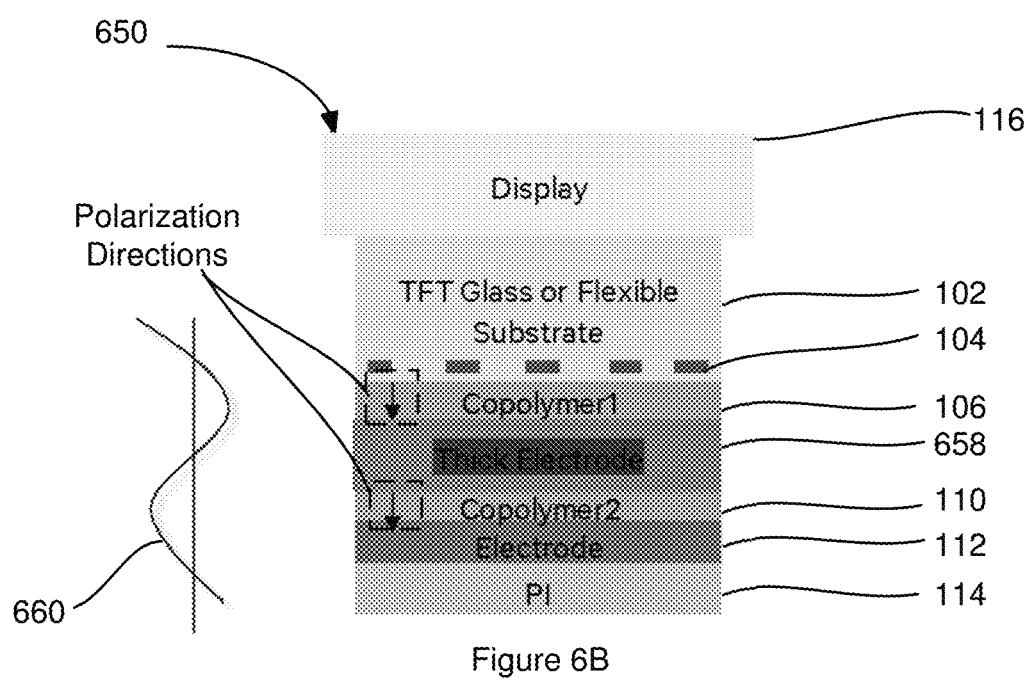
FIG. 6B shows a representative example of a side-view cutaway of an alternative embodiment of an ultrasonic sensor with multiple copolymer layers with uni-poling direction and a thick electrode.

FIG. 6B shows a representative example of a side-view cutaway of an alternative embodiment of an ultrasonic sensor with multiple copolymer layers and a thick electrode 650. In FIG. 6B, a first copolymer layer 106 may be adhered to the pixel array 104 or TFT glass of flexible substrate 102. A thick electrode 658 may be adhered to the first copolymer layer 106. A second copolymer layer 110 may be adhered to the thin electrode 608. A second electrode 112 may be adhered to the second copolymer layer 110. The second copolymer layer 110 may be adhered to a substrate layer 114. The substrate layer 114 may be polyimide, or a die attach film, or other suitable substrate. The thick electrode 658 may be between 100 um to 400 um. The thick electrode 658 should be thick enough such that the peak of an incident wave 610 traveling through the stack 600 would expose at the first copolymer layer 106 to a peak of an incident wave 660 and the second copolymer layer 110 to the trough of an incident wave 660 substantially simultaneously.

In FIG. 6B, the polarization directions of the first copolymer layer 106 and the second copolymer layer 110 is shown in the dashed boxes indicated by "Polarization Direction." In FIG. 6A, a polarization direction of the first copolymer layer 106 is downwards as indicated by the arrow in the dashed box, and a second polarization direction of the second copolymer layer 110 is upwards and opposite to the first copolymer layer 106 as indicated by the arrow in the dashed box. This embodiment of FIG. 6B may be termed a serial bilayer configuration. An advantage of this embodiment would be an easier manufacturing process because the two piezoelectric layers are poled along the same directions.

Figure 7A:
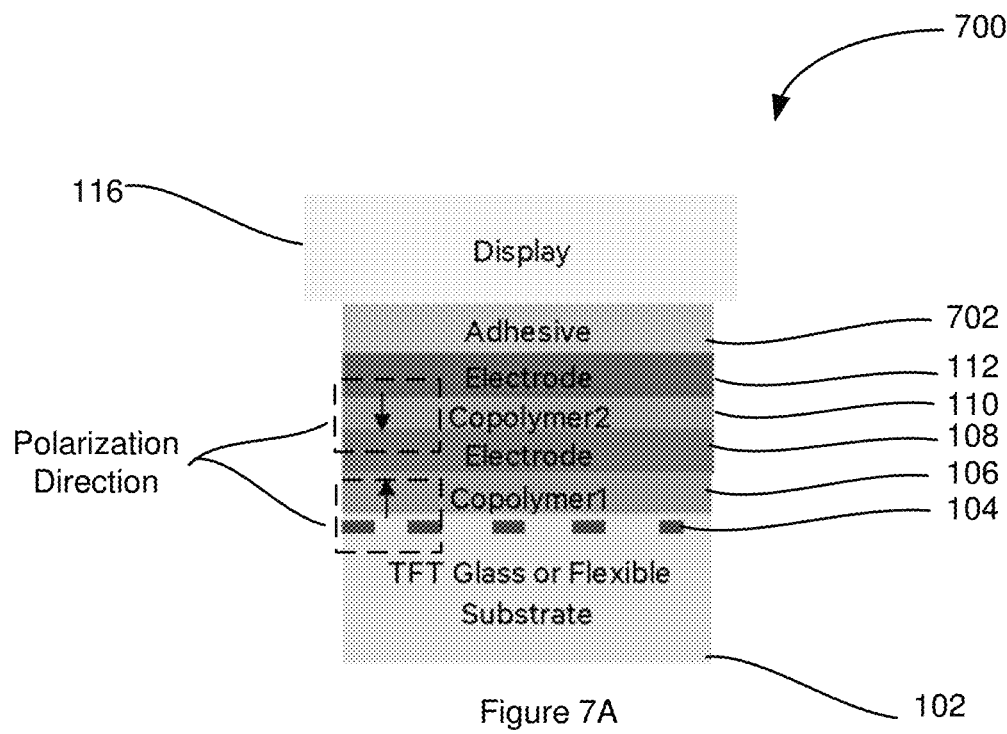
FIG. 7A shows a representative example of a side-view cutaway of an ultrasonic sensor with multiple copolymer layers poling along different directions with the pixel layer down.

FIG. 7A shows a representative example of a side-view cutaway of an ultrasonic sensor with multiple copolymer layers with the pixel layer down 700. In FIG. 7A, a first copolymer layer 106 may be adhered to the pixel array 104 or TFT glass or flexible substrate 102. A first electrode 108 may be adhered to the first copolymer layer 106. A second copolymer layer 110 may be adhered to the first electrode 108. A second electrode 112 may be adhered to the second copolymer layer 110. The second electrode 112 may be adhered via an option adhesive layer 702 to a display 116.

In FIG. 7A, the polarization directions of the first copolymer layer 106 and the second copolymer layer 110 is shown in the dashed boxes indicated by "Polarization Direction." In FIG. 1A, a polarization direction of the first copolymer layer 106 is upwards as indicated by the arrow in the dashed box, and a second polarization direction of the second copolymer layer 110 is downwards and opposite to the first copolymer layer 106 as indicated by the arrow in the dashed box. FIG. 7A represents an alternative embodiment which allows the display 116 to be opposite the TFT glass or flexible substrate 102.

Figure 7B:
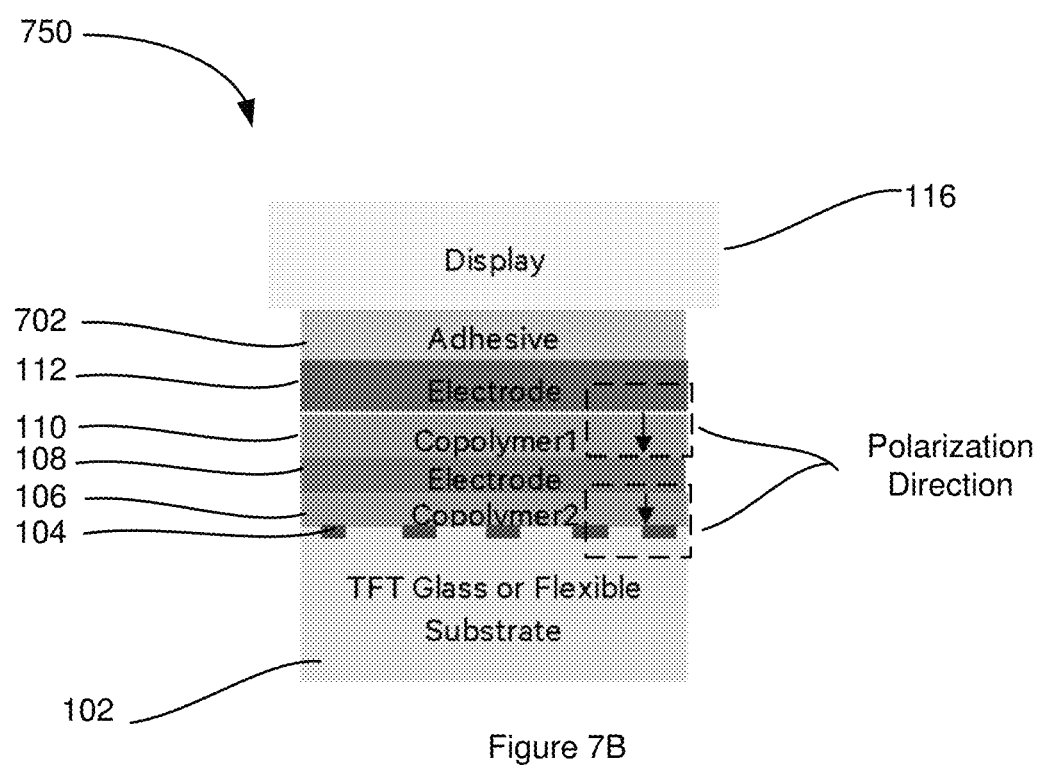
FIG. 7B shows a representative example of a side-view cutaway of an alternative embodiment of an ultrasonic sensor with multiple copolymer layers poling along the same direction with the pixel layer down.

FIG. 7B shows a representative example of a side-view cutaway of an alternative embodiment of an ultrasonic sensor with multiple copolymer layers with the pixel layer down 750. In FIG. 7B, a first copolymer layer 106 may be adhered to the pixel array 104 or TFT glass or flexible substrate 102. A first electrode 108 may be adhered to the first copolymer layer 106. A second copolymer layer 110 may be adhered to the first electrode 108. A second electrode 112 may be adhered to the second copolymer layer 110. The second copolymer layer 110 may be adhered to a substrate layer 114. The substrate layer 114 may be polyimide, or a die attach film, or other suitable substrate.

In FIG. 7B, the polarization directions of the first copolymer layer 106 and the second copolymer layer 110 is shown in the dashed boxes indicated by "Polarization Direction." In FIG. 7B, a polarization direction of the first copolymer layer 106 is downwards as indicated by the arrow in the dashed box, and a second polarization direction of the second copolymer layer 110 is downwards and the same as the first copolymer layer 106 as indicated by the arrow in the dashed box. FIG. 7A represents an alternative embodiment which allows the display 116 to be opposite the TFT glass or flexible substrate 102. Similarly, the display 116 could be placed opposite the TFT glass or flexible substrate 102 in alternative embodiments with more than two copolymer layers, similar to those of FIGS. 3A and 3B.

Figure 8:
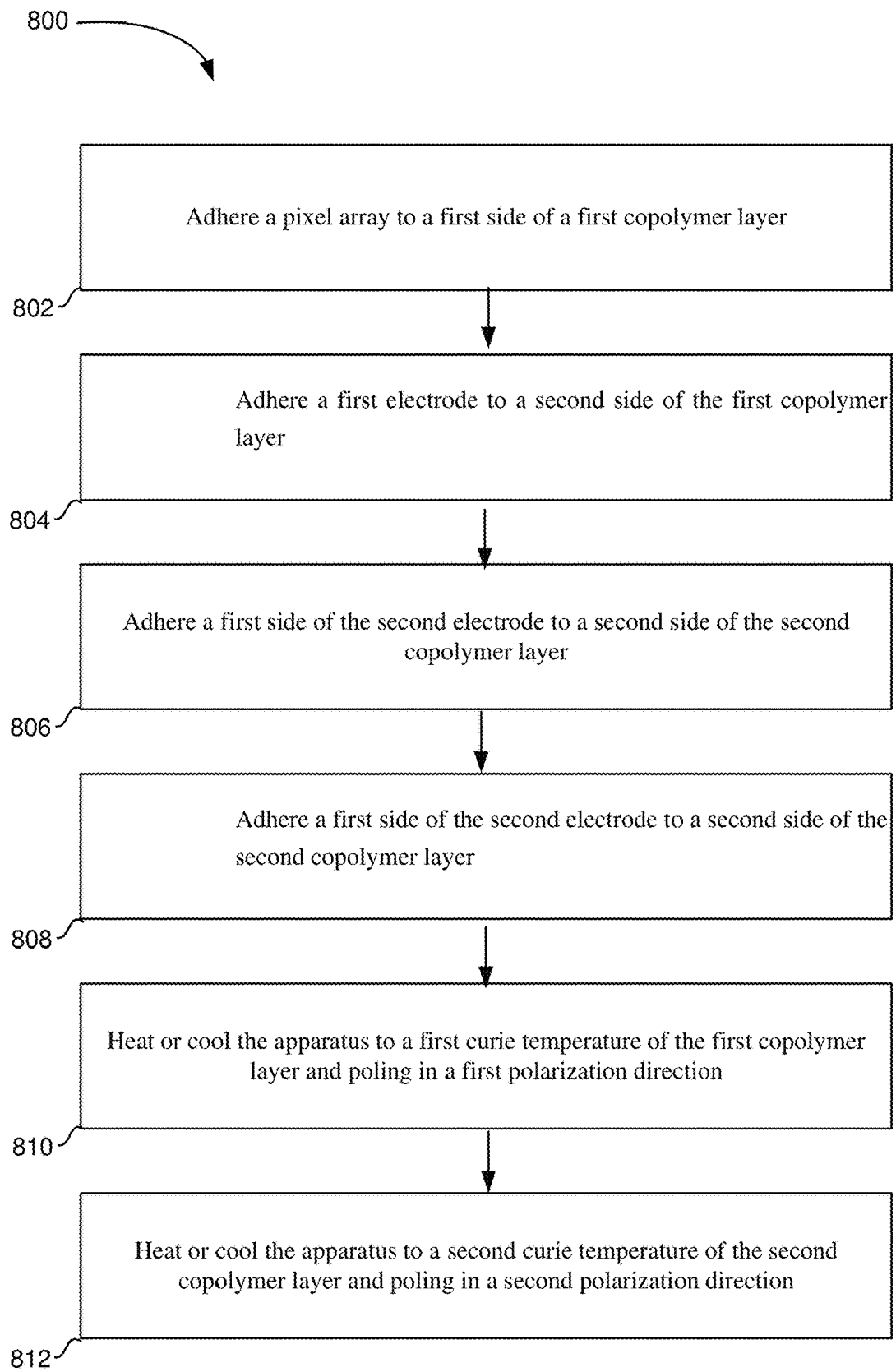
FIG. 8 shows an exemplary flow diagram of a process for manufacturing an apparatus for biometric sensing also known as a multi-copolymer layer sensor.

FIG. 8 shows an exemplary flow diagram of a process for manufacturing an apparatus for biometric sensing also known as a multi-copolymer layer sensor 800. In a process for manufacturing a multi-copolymer layer sensor 800, step 802 comprises adhering a pixel array to a first side of a first copolymer layer; step 804 comprises adhering a first electrode to a second side of the first copolymer layer; step 806 comprises adhering a first side of a second copolymer layer to a second side of the first electrode; step 808 comprises adhering a first side of the second electrode to a second side of the second copolymer layer; step 810 comprises heating or cooling the apparatus to a first curie temperature of the first copolymer and poling in a first polarization direction; and step 812 comprises heating or cooling the apparatus to a second curie temperature of the second copolymer and poling in a second polarization direction. In alternative embodiments, intermediate steps may be added. For example, in a process for manufacturing a multi-copolymer layer sensor, there may be a step for adhering additional electrodes or copolymer layers. There may also be a step for adhering a substrate. There may also be a step for adhering a display.

In one embodiment, after step 808, the apparatus may be poled in a first direction at a first temperature with a first electric field, annealed at a second temperature (normally a temperature between two Curie Temperatures), for a period of time, then poled in a second direction at the second temperature. The apparatus may then gradually cool down to room temperature after or during the second poling.

In another embodiment, after step 808, the apparatus may be poled in a first direction at a first temperature, then poled in a second direction at a second temperature normally lower than the first temperature, without an annealing step. The apparatus may then gradually cool down to room temperature after or during the second poling.

Generally, in a process for manufacturing an apparatus for biometric sensing also known as a multi-copolymer layer sensor 800, the process may begin with coating a solution containing a copolymer onto an array of pixel circuits. The copolymer is then crystallized. As described in more detail hereinbelow, a crystallization process may include a baking procedure. The baking procedure may remove residual solvent in the copolymer layer and aid in annealing and crystallizing the copolymer layer. For example, in some implementations, a pixel circuit array and substrate, after being coated with the copolymer, are raised to a temperature above the Curie temperature of the copolymer, but below the melting point of the copolymer. When a copolymer is held at such a temperature for a sufficient length of time, crystallization of the copolymer will result. The crystallized copolymer is then poled so as to form the piezoelectric layer. A poling process involves applying a strong electric field across the material so as to align dipoles of the copolymer in a desired orientation. The voltage potential across the copolymer layer to achieve poling may vary with the thickness of the crystallized copolymer coating. For example, in some implementations, an electric field strength of approximately 100-200 volts per micron of coating thickness has been found to be effective in forming a piezoelectric layer.

Figure 9:
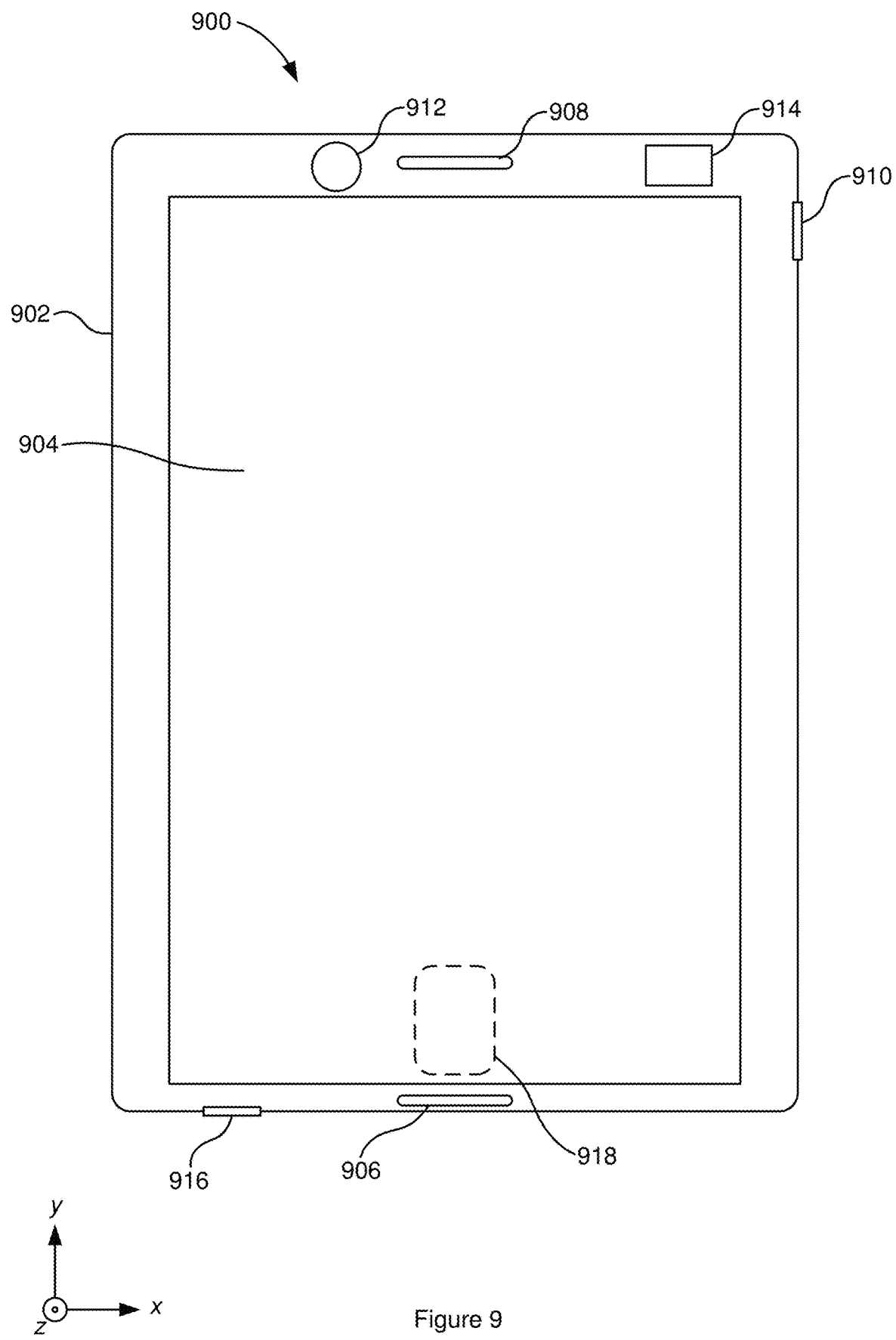
FIG. 9 shows an exemplary diagram of an electronic device incorporating an ultrasonic sensor with multiple copolymer layers.

FIG. 9 shows a front view of a diagrammatic representation of an example of an electronic device 900 that includes an ultrasonic sensor with multiple copolymer layers 918 according to some implementations. The electronic device 900 may be representative of, for example, various mobile devices or portable computing devices such as cellular phones, smartphones, multimedia devices, personal gaming devices, tablet computers and laptop computers, among other types of portable computing devices. However, various implementations described herein are not limited in application to portable computing devices. Indeed, various techniques and principles disclosed herein may be applied in traditionally non-portable devices and systems, such as in computer monitors, television displays, kiosks, vehicle navigation devices and audio systems, among other applications. Additionally, various implementations described herein are not limited in application to devices that include displays.

In the illustrated implementation, the electronic device 900 includes a housing (or "case") 902 within which various circuits, sensors and other electrical components may be disposed. In the illustrated implementation, the electronic device 900 also includes a display (that may be referred to herein as a "touchscreen display" or a "touch-sensitive display") 904. The display 904 may generally be representative of any of a variety of suitable display types that employ any of a variety of suitable display technologies. For example, the display 904 may be a digital micro-shutter (DMS)-based display, a light-emitting diode (LED) display, an organic LED (OLED) display, a liquid crystal display (LCD), an LCD display that uses LEDs as backlights, a plasma display, an interferometric modulator (IMOD)-based display, or another type of display suitable for use in conjunction with touch-sensitive user interface (UI) systems.

The electronic device 900 may include various other devices or components for interacting with, or otherwise communicating information to or receiving information from, a user. For example, the electronic device 900 may include one or more microphones 906, one or more speakers 908, and in some cases one or more at least partially mechanical buttons 910. The electronic device 900 may include various other components enabling additional features such as, for example, one or more video or still-image cameras 912, one or more wireless network interfaces 914 (for example, Bluetooth, WiFi or cellular) and one or more non-wireless interfaces 916 (for example, a universal serial bus (USB) interface or an HDMI interface).

The electronic device 900 may include an ultrasonic sensor with multiple copolymer layers 918 capable of imaging an object signature, such as a fingerprint, palm print or handprint. In some implementations, the ultrasonic sensing system 918 may function as a touch-sensitive control button. In some implementations, a touch-sensitive control button may be implemented with a mechanical or electrical pressure-sensitive system that is positioned under or otherwise integrated with the ultrasonic sensor with multiple copolymer layers 918. In other words, in some implementations, a region occupied by the ultrasonic sensor with multiple copolymer layers 918 may function both as a user input button to control the electronic device 900 as well as a sensor to enable security features such as user authentication based on, for example, a fingerprint, palm print or handprint.

Thus, an ultrasonic sensor with bi-poled or uni-poled transmitter/receiver has been disclosed. It will be appreciated that a number of alternative configurations and fabrication techniques may be contemplated.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

What is claimed is:

1. An apparatus for biometric sensing, the apparatus comprising:
   a pixel array;
   a first copolymer layer;
   a second copolymer layer;
   a third copolymer layer;
   a fourth copolymer layer;
   a first electrode;
   a second electrode;
   a third electrode;
   a fourth electrode; and
   an isolation layer;
   wherein a top side of the first copolymer layer is proximate to the pixel array, a bottom side of the first copolymer layer is bonded to a top side of the first electrode, a bottom side of the first electrode is bonded to a top side of the second copolymer layer, and a bottom side of the second copolymer layer is bonded to a top side of the second electrode;
   wherein a top side of the third copolymer layer is bonded to a bottom side of the second electrode through the isolation layer, a bottom side of the third copolymer layer is bonded to a top side of the third electrode, a bottom side of the third electrode is bonded to a top side of the fourth copolymer layer, and a bottom side of the fourth copolymer layer is bonded to a top side of the fourth electrode; and
   wherein the first copolymer layer has a first polarization direction, the second copolymer layer has a second polarization direction, the third copolymer layer has a third polarization direction, and the fourth copolymer layer has a fourth polarization direction.

2. The apparatus of claim 1, wherein the first polarization direction is the same as the second polarization direction.

3. The apparatus of claim 2, wherein a thickness of the first electrode is greater than 100 um.

4. The apparatus of claim 1, wherein the first polarization direction is the opposite of the second polarization direction, and wherein the first electrode is alternatively grounded or floating.

5. The apparatus of claim 4 wherein a thickness of the first electrode is less than 30 um.

6. The apparatus of claim 1 wherein the first, second, third, and fourth polarization directions are the same.

7. The apparatus of claim 1 wherein the first and third polarization directions are the same and opposite to the second and fourth polarization directions, and wherein the first and second electrodes is alternatively grounded or floating.

8. The apparatus of claim 1, further comprising a display, wherein the display is proximate to the pixel array.

9. The apparatus of claim 1, further comprising a display, wherein a bottom side of the display is adhered, via an adhesive layer, to the top side of the first copolymer layer.

10. The apparatus of claim 1, wherein the apparatus for biometric sensing is embodied within a mobile device.

* * * * *